(12) United States Patent
Hunt et al.

(10) Patent No.: US 6,975,500 B2
(45) Date of Patent: Dec. 13, 2005

(54) CAPACITOR HAVING IMPROVED ELECTRODES

(75) Inventors: Andrew T. Hunt, Atlanta, GA (US); Mark G. Allen, Atlanta, GA (US); David Kiesling, Atlanta, GA (US)

(73) Assignee: nGimat Co., Atlanta, GA (US)

( * ) Notice: Subject to any disclaimer, the term of this patent is extended or adjusted under 35 U.S.C. 154(b) by 96 days.

(21) Appl. No.: 10/476,867

(22) PCT Filed: May 9, 2002

(86) PCT No.: PCT/US02/14861

§ 371 (c)(1),
(2), (4) Date: Nov. 5, 2003

(87) PCT Pub. No.: WO03/005385

PCT Pub. Date: Jan. 16, 2003

(65) Prior Publication Data

US 2004/0241401 A1    Dec. 2, 2004

Related U.S. Application Data

(60) Provisional application No. 60/290,122, filed on May 10, 2001.

(51) Int. Cl.$^7$ ............................................. H01G 4/228
(52) U.S. Cl. .................. 361/306.3; 361/313; 361/303; 361/736

(58) Field of Search ............................. 361/306.3, 303, 361/306.1, 309, 311–313, 321.2, 321.1, 301.1, 361/736, 321.3

(56) References Cited

U.S. PATENT DOCUMENTS 5,440,157 A * 8/1995 Imai et al. .................. 257/310
5,641,702 A * 6/1997 Imai et al. .................. 438/396

* cited by examiner

Primary Examiner—Anthony Dinkins
(74) Attorney, Agent, or Firm—Alfred H. Muratori; Wayne E. Nacker

(57) ABSTRACT

Capacitor material for use in forming capacitors, is disclosed. More specifically, the invention is directed to capacitors formed from this material that have one or more discrete electrodes (314), each electrode (314) being exposed to at least two thicknesses of dielectric material (300). These electrodes (314) are surrounded by wider insulative material (312) such that the material can be cut, or patterned into capacitors having specific values. A single electrode can form a small value capacitor while still providing a larger conductive area for attaching the capacitor to associated circuitry. The thin dielectric (310) can be a tunable material so that the capacitance can be varied with voltage. The tunability can be increased by adding thin electrodes that interact with direct current.

38 Claims, 9 Drawing Sheets

CAPACITOR HAVING IMPROVED ELECTRODES

This application claims the benefit of U.S. Provisional application Ser. No. 60/290,122 filed May 10, 2001.

FIELD OF THE INVENTION

The present invention is directed to capacitors. In particular, the invention is directed to capacitors having one or more discrete electrodes, the electrodes being formed such that one of the capacitor conductor surface areas extending to the thin film dielectric is much smaller than the conductor surface area in the zone of the thicker dielectric. In these structures, the capacitance is dominated by the thinner dielectric, and the voltages required for producing changes in paraelectric, ferroelectric and other electrically affected material characteristics, are minimized. The invention also includes several embodiments of electrodes formed on supporting substrates and bulk dielectrics.

BACKGROUND OF THE INVENTION

Parallel plate capacitors have been in manufacture for many years. The basic design of these capacitors involves two conductive electrodes separated by a dielectric or insulative thin film material. While many variations of this type of capacitor have been developed, all of the known designs suffer from the following disadvantages. One of these disadvantages is the condition wherein a small defect in the dielectric layer wherein the two electrodes are allowed to short together. This short circuit renders the entire capacitor useless, resulting in loss of product. A second disadvantage is the inability to take a single sheet of capacitor material (formed of a sandwich of conductive material on the outside and thin film dielectric material on the inside), and cut this material into several smaller value capacitors and attaching connectors to the conductive portions of these smaller value capacitors. This inability is due to the shorting out of the conductive layers by the cutting, shearing or connecting action itself that creates defects in the dielectric, resulting in high leakage and potential shorts. The present invention overcomes these disadvantages by providing discrete locations of electrode interaction, thereby allowing failure points to be removed, as well as allowing a simple method of forming capacitors with specific capacitance. Furthermore, due to the reduced active electrode area, capacitors with small capacitance can be formed while still allowing enough surface area for connecting the capacitor to other circuitry. These thin dielectrics, if ferroelectric, such as barium strontium titanate (BST), can have the capacitance varied by applying a bias voltage. The thinner the dielectric, the lower the bias voltage can be to effect the same capacitance change. These tunable capacitors have a wide range of applications particularly in the RF wireless arena.

In the field of tunable capacitors that use ferroelectric dielectrics, a particular problem is intermodulation distortion (IMD), that can occur as the RF electric field inadvertently biases the material at the RF frequency. This problem is addressed by the present invention by providing several embodiments of capacitor electrodes that allow greater levels of tunability, while reducing RF interaction with the biasing electrodes.

SUMMARY OF THE INVENTION

The present invention is directed to several embodiments of capacitors each of which includes one or more electrodes, that are exposed to one or more dielectric layers. One method of forming the capacitor is by first depositing a thin dielectric material having a relatively high dielectric constant (k) (preferably BST) onto a conductive metal substrate (such as nickel). A layer of insulative material (such as glass or epoxy) with a relatively low dielectric constant (k) is then deposited on top of the dielectric material. The insulative material is then selectively etched to remove material from electrode sites. The electrode sites are preferably circular but may be other shapes as well. The diameter of the sites are on the order of about 1–40 $\mu$m, most preferably 4–15 $\mu$m. Once the insulative material has been removed from the sites, a top layer of metal (such as copper) is deposited on the insulative material. This metal fills the sites thereby sandwiching the thin film dielectric between the site (electrode) and the bottom conductive material to form a capacitor. It should be understood that the capacitor or insulator material can be formed by other methods such as silk screening the insulative layer to form the sites. In addition, the dielectric material may initially be deposited on a non-conductive substrate, and the substrate can be removed after the top layers have been deposited and then a conductive material can be deposited on the dielectric material. This may be useful to allow formation of epitaxial dielectrics by using an initial, non-conductive epitaxial substrate (such as sapphire) and then replacing the sapphire with copper or other non-epitaxial conductors after formation of the dielectric.

Alternatively, the thick dielectric can be formed as a conductor, and spires of conductor can be formed to the surface of the thick dielectric. Methods of forming these spires or "nanostructures" can be found in U.S. Pat. No. 6,372,364, entitled "NANOSTRUCTURE COATINGS, which issued to Hunt et al. on Apr. 16$^{th}$, 2002, and is hereby incorporated by reference. The thin dielectric can be formed across both the conductive spire ends and the thick dielectric, or selectively just on the conductor. A conductor is then formed over this surface. The end result is the same as a product having a capacitance defined by the much smaller (but much closer) electrode surface.

Another important factor is the robustness of the end device. If the first conductor is metal or more specifically metal foil, and the thin dielectric is ceramic, then the interfaces between the ceramic and metal can be potential points of failure, as is well understood in the art. By forming high adhesion materials on the dielectric that are thicker and more robust, (even self supporting if formed independently of the other layers or components), the result is a more robust product. The capacitance for a specific area is a function of thickness and dielectric constant. Therefore, the thinner the dielectric compared to the insulator, (>3 times thinner, >10 times thinner and preferably >20 times thinner), the higher the capacitance from the thin dielectric for a given device. Furthermore, the dielectric should have at least as high a dielectric constant as the insulator, preferably >2 times higher, 5 times higher or most preferably more than 10 times higher, particularly when these layers have similar or close thicknesses compared to each other.

The discrete electrodes formed by filling the sites with conductive material are preferably arranged in an array. By forming the electrodes in an array, it is easier to divide, pattern or slice the material along lines that do not intersect the electrodes. In this manner, the dividing, patterning or slicing takes place at points that include relatively thick portions of insulative material, thereby reducing the chances of shorting out the two conductive layers. Defining the material into smaller pieces reduces the number of and/or area of the plates and therefore the capacitance of the sheet. The resulting capacitor may include as little as a single site to form a small value capacitor, or a number of sites for higher capacitance, while still allowing a larger surface area (the conductive top and bottom layers) for attachment to associated circuitry.

In a further embodiment, one or more additional conductive material layer(s) are provided. This layer or layers are formed of a first conductive material that has a relatively low conductivity, while the conductive material of the electrode sites and connecting the electrode sites, is formed of a second conductive material that has a relatively high conductivity. This is particularly useful in tunable capacitors used in RF applications. The lower conductivity material has a slower response to applied electric fields between the top and bottom conductors. Therefore, the DC (or low frequency AC) biasing voltage creates a stronger electric field through the tunable dielectric then the applied RF signal. Lower tuning voltages can be used to create the required change in the dielectric material, while the RF signal is applied across a larger distance. As is known, when the RF signal affects the dielectric constant of the material, intermodulation distortion (IMD) can occur. By reducing the strength of the applied RF electric field compared to the DC field, low tuning voltages are achieved with reduced interaction of the RF field. Conductivity of the material is dependent on the number of charge carriers, and the charge carrier mobility. By forming the additional layers from a material having a low charge carrier mobility, the additional layers can be used as electrodes to apply the DC biasing signal over a small distance (large effective electric field), while resisting the voltage of the applied RF signal (as the charge carriers cannot react to the speed of the changing RF signal). The formation of these "low-loss" electrodes is more fully described in International Patent Application No. PCT/US01/26491, published on Feb. 28$^{th}$, 2002 as WIPO Publication No. WO 02/16973, entitled "ELECTRONIC AND OPTICAL DEVICES AND METHODS OF FORMING THESE DEVICES" and hereby incorporated by reference in its entirety.

The terms "low loss" and lower conductivity, as applied to the capacitor electrodes of the present invention are defined herein as materials that have a low charge carrier mobility or a reduced number of charge carriers (charge carrier density). The conductivity of a material is equal to the electronic charge times the charge carrier mobility times the charge carrier density (for both electrons and holes). In some of the embodiments of the capacitor electrodes of the present invention, it is preferred that the low conductivity material has a low charge carrier mobility (less than 10 cm$^2$/V·s, preferably less than 5 cm$^2$/V·s and most preferred less than 0.10 cm$^2$/V·s). In other embodiments it is preferred that the charge carrier mobility be relatively high (preferably greater than 30 cm$^2$/V·s, more preferably greater than 100 cm$^2$/V·s, and most preferred greater than 1000 cm$^2$/V·s), while the "available" charge carrier density is controlled. The term "available", relates to the ability of the RP signal to interact with the charge carriers. Some of the embodiments included herein control the availability of these charge carriers to the RF signal by using a DC of low frequency AC bias to "lock" these charge carriers in place. Preferably 30%, 50% or more of the total charge carriers can be controlled in this manner, thus the available charge carrier density is 70%, 50% or less of the total charge carrier density. In some embodiments, the specific mechanisms are irrelevant and the low conductivity material can be defined in terms of its resistivity. Preferably this resistivity is 100 Ω/square or less.

These low-loss electrodes have further utility in other embodiments of the capacitor of the present invention that use bulk dielectric material. By forming low loss interdigital electrodes on a surface of a bulk dielectric, the advantages of the low loss electrodes can be applied to relatively inexpensive dielectric material that is commercially available in bulk form. While the DC biasing electric field and the RF electric field may only permeate partially through the dielectric material, the advantages of low-loss, tunability, and reduced IMD, are still possible. Besides the reduced cost of the dielectric material, another advantage of using the bulk dielectric is reduced manufacturing steps as described below with reference to the figures.

DETAILED DESCRIPTION OF THE PREFERRED EMBODIMENTS

The present invention may be understood more readily by reference to the following detailed description of preferred embodiments of the invention and the figures.

Figure 1:
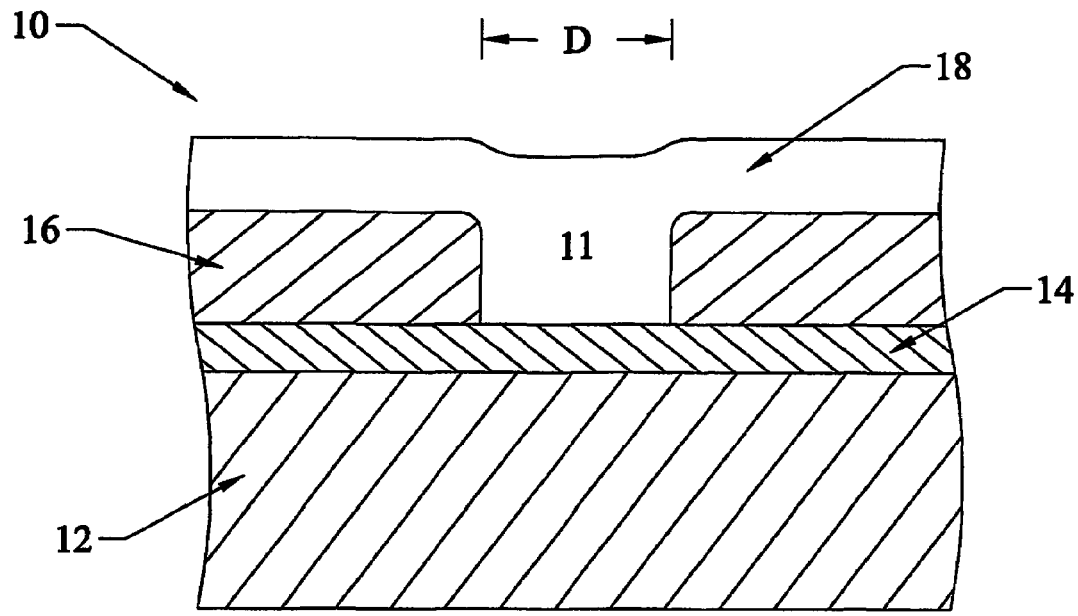
FIG. 1 shows a cross-section of an electrode of the capacitor material of the present invention.

FIG. 1 is a cross-sectional view through an electrode site in the laminate capacitor material 10 of the present invention. A conductive substrate 12 is coated with a layer of dielectric material 14 having, preferably, a relatively high dielectric constant (k). On top of the dielectric material 14 is a layer of insulative material 16 or material having a relatively low dielectric constant (k). The insulative material 16 is either not deposited or removed from the electrode site 11, as previously described. Conductive material 18 is then coated on top of the insulative material 16 and fills the voids at the site 11 locations. Alternatively, the electrodes are formed first, and then the insulator is filled in. In this manner, discrete capacitors are formed between electrode layers 18 and 12 at the site 11 locations. Each site 11 has a diameter D on the order of 1–40 μm, and more preferably about 4–15 μm. At the site 11 locations, the electrode layers 12 and 18 (which includes the material of site 11) are closer together (on the order of 50–5000 nanometers, preferably 100–1000 nanometers, most preferably 150–500 nanometers) with only the high k material layer 14 between them. At all other locations, the electrode layers 12 and 18 are separated by the insulative layer 16 as well as the dielectric layer 14. The thickness of the dielectric material 14 and the insulative material 16, is >3 times thicker (150 nm–15,000 nm), >10 times thicker (500 nm–50,000 nm) and most preferably >20 times thicker (1000 nm–100,000 nm) than the dielectric layer 14 alone. Thus a plurality of discrete capacitors are formed at the site locations 11 with little or negligible capacitance (<25%, <5% or preferably <1%) being contributed by the other portions of the laminate material 10. The total surface area of the dielectric material 14 (which is substantially the same as the area of the electrode layer 18) is preferably greater twice the total surface area of all the electrode sites 11 that contacts the dielectric material 14, and more preferably is 5, 10, 20 or most preferably 50 times greater.

Figure 2:
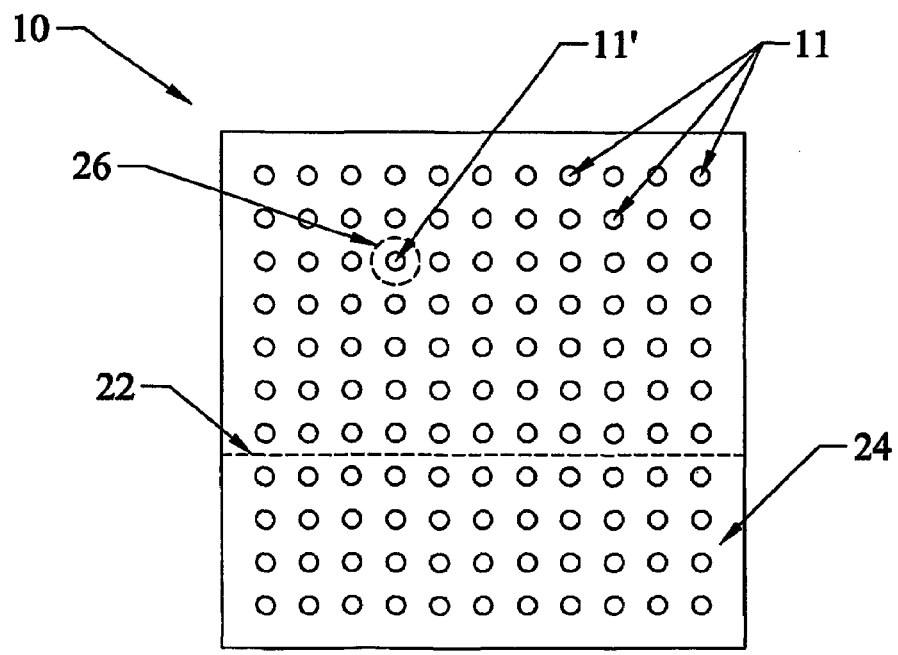
FIG. 2 shows a top view of the capacitor material of FIG. 1.

FIG. 2 shows a top schematic view of the laminate material 10, with the site 11 locations being illustrated for discussion purposes only (these locations would not appear as sharp transitions through conductive layer 18, but rather as dimples in conductive layer 18). Each site 11 functions as a discrete capacitor in parallel with all of the other sites 11 to form a capacitor array with a capacitance equal to all of the discrete capacitors' capacitance added together. By cutting the material into sections (as shown by dotted line 22) a capacitor 24 of specific capacitance can be formed. As shown, the cutting line 22 is formed between sites 11 to reduce the chance of shorting the two conductive layers 12 and 18 together as previously described. In addition, should a particular site (shown for example as 11') fail (short out) then this site (or other failed area) can be removed. One method of removal is by cutting or punching out the area as shown by dotted line 26.

Figure 3A:
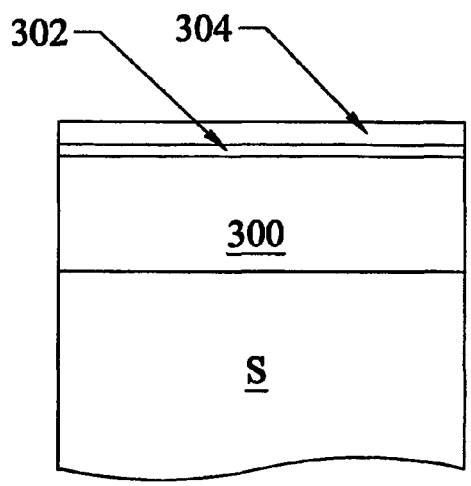
FIGS. 3a–3h illustrate one method of producing the capacitor material of FIG. 1.
Figure 3B:
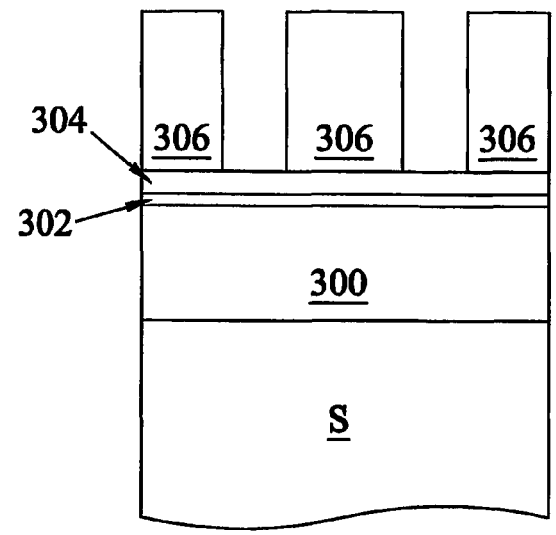
Figure 3C:
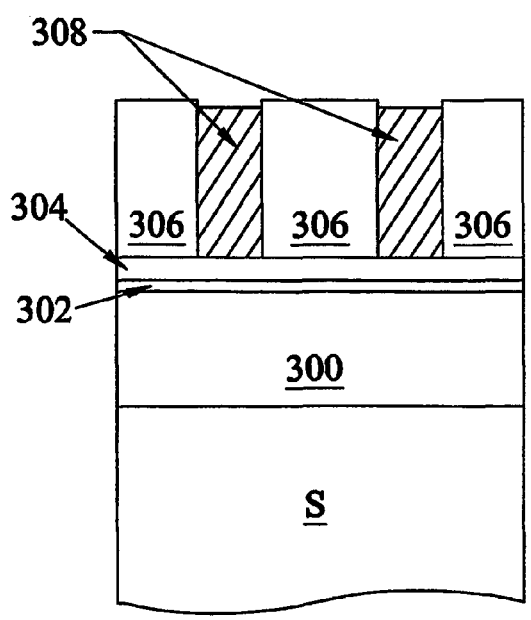
Figure 3D:
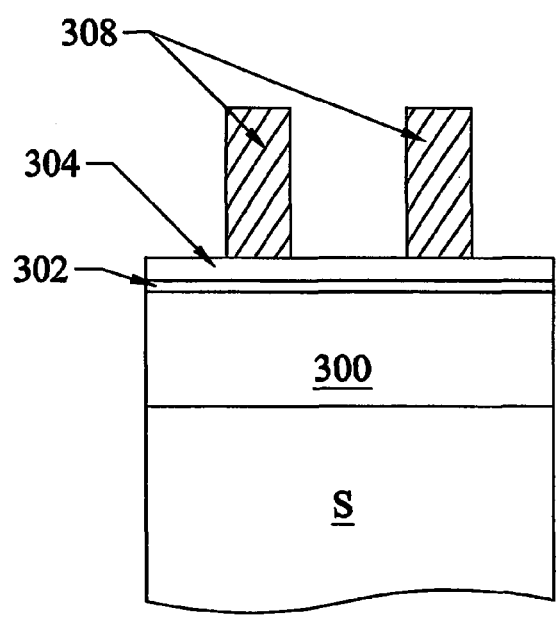
Figure 3E:
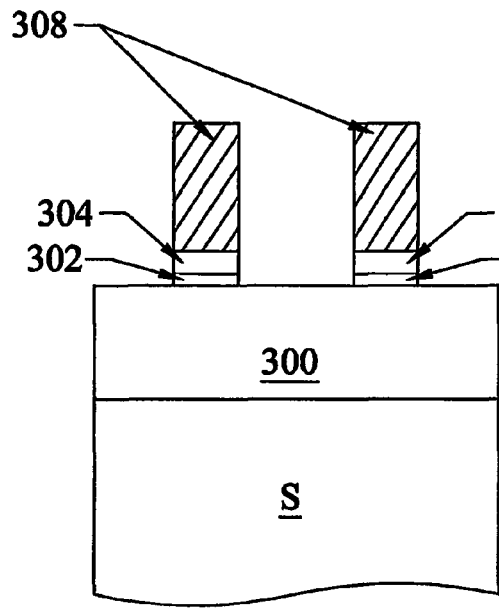

FIGS. 3a–3h show steps of one particular method of producing the capacitor material of the present invention, it being understood that there are a number of other methods equally capable of producing the invention. FIG. 3a shows a dielectric material with a relatively high dielectric constant (for example, BST) 300 deposited on a substrate S made of a suitable material. The substrate is preferably a good conductor such as copper, gold or platinum. Other materials may be used as well (such as sapphire or textured nickel to aid in epitaxial growth of the upper layers, if needed), and it should also be understood that substrate S may be removed after deposition of the other layers, and a conductor can be deposited in its place. On top of the dielectric material 300 is a first, optional layer 302 and a second seed layer 304. Seed layer 304 is formed of conductive material (such as Cu, Pt, Ag, etc.), while optional layer 302 is formed of a material (Cr, SiO2, etc.) that aids in adhesion of layers 304 and 300, but need not necessarily be conductive. Another optional layer may be used between substrate S and dielectric layer 300 to aid in adhesion between these layers. In FIG. 3b, a layer of photoresist 306 is show deposited on top of layer 304, with the photoresist removed from locations where electrode sites will be formed. As shown in FIG. 3c, additional conductive material 308 is deposited on the exposed portions of seed layer 304 using electroplating (layer 304 being conductive) or other suitable deposition techniques. Once the additional conductive material 308 has been deposited, the photoresist 306 can be removed as shown in FIG. 3d. A flash etch is then used to remove those portions of layers 302 and 304 not protected by the additional conductive material 308 (those portions between the electrode sites). As layers 304 may be formed of the same material as the additional conductive material 308, the flash etch may remove some of the additional material 308, although this should be negligible, or may be considered when determining the thickness of material 308 to be deposited. Also alternatively, the photoresist 306 can be applied prior to the seed layer 304, and any conductive material deposited on the photoresist 306, will be removed when the photoresist 306 is removed in subsequent processing steps. Further if the optional layer 302 is thin enough, it may be left in, as can the photoresist 306 if it is stable and acts as an insulator. In these ways, the number of processing steps can be reduced.

Figure 3F:
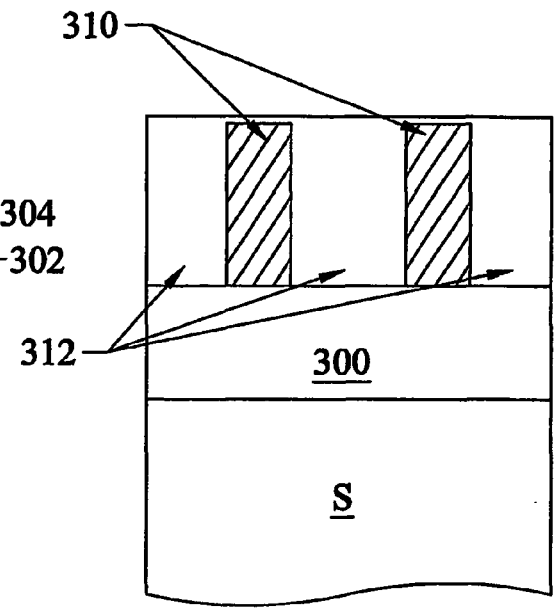
Figure 3G:
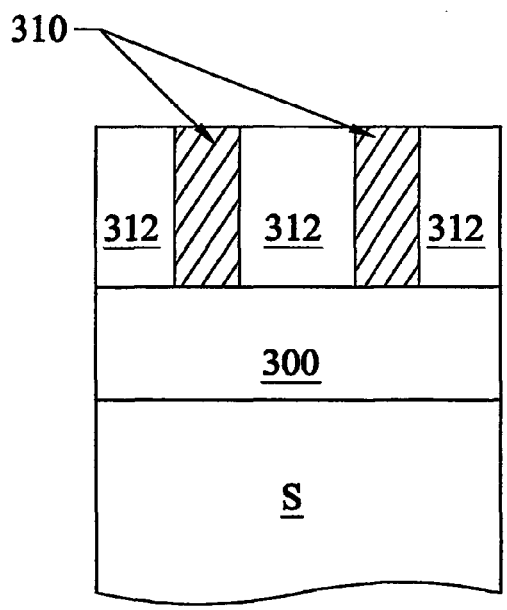
Figure 3H:
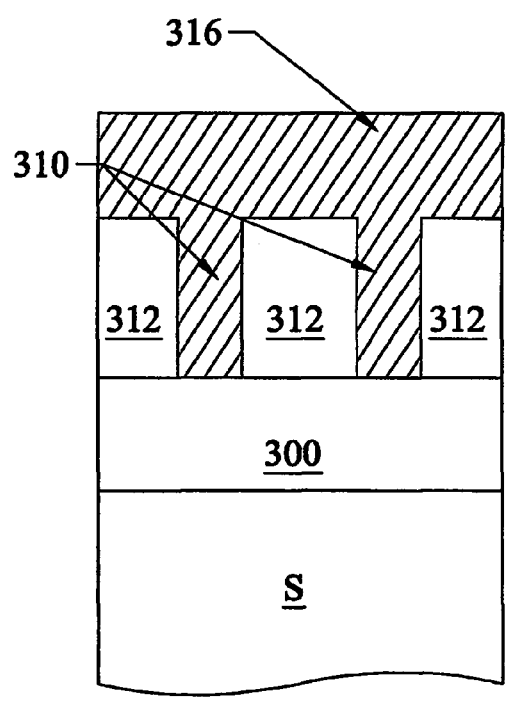

After removing the portion of layers 302 and 304 between electrode sites, a thicker insulator, preferably, with a relatively low dielectric constant 312 is deposited in the spaces between the electrode sites (note that all the conductive material is labeled as 310 in FIGS. 3f–3h, for clarity). While the resistive material 312 is primarily deposited between electrode sites, some of this material may form a thin layer on top of conductive material 310. FIG. 3g shows the conductive material 310 and the insulative material 312 after the top has been shaved (possible using chemical and/or mechanical polishing (CMP) to remove insulative material from the tops of the electrodes. A final layer of conductive material 316 is then deposited to electrically join all of the electrodes, as shown in FIG. 3h.

Figure 3I:
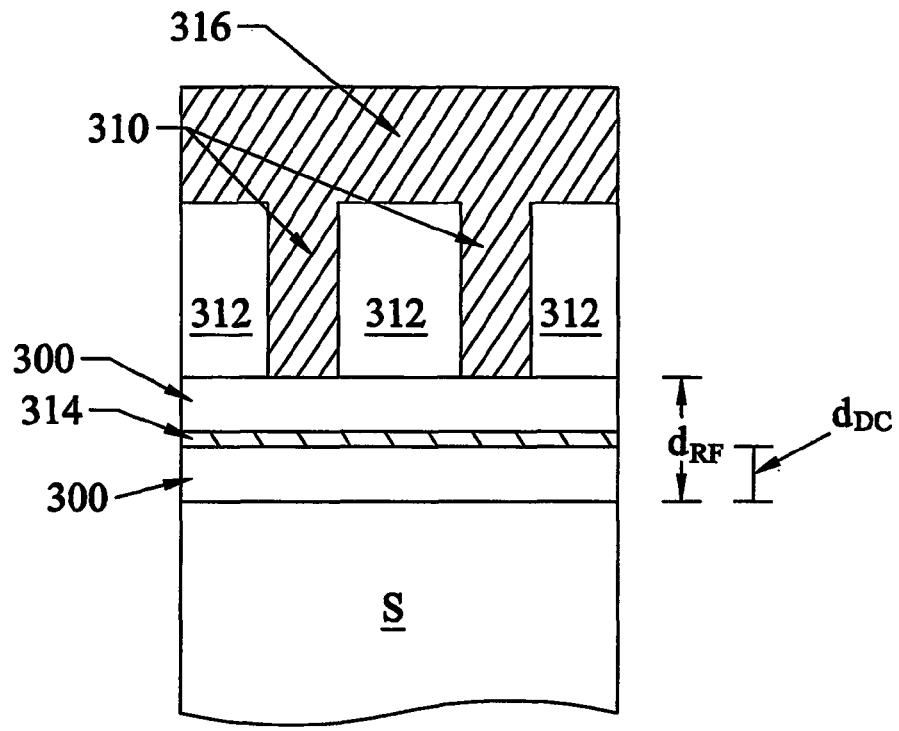
FIGS. 3i and 3j show further embodiments of the capacitor material of FIG. 1.
Figure 3J:
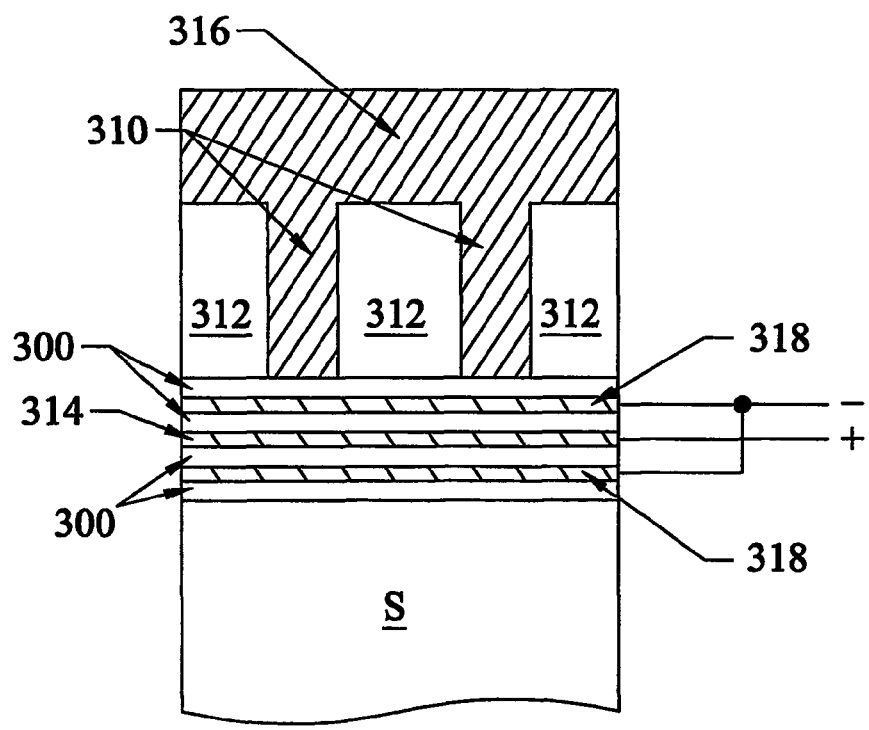

FIGS. 3i and 3j illustrate further embodiments of the capacitor material of FIGS. 3a–3h. The same steps in forming the material and electrodes 310, as described above with respect to FIGS. 3a–3h, can be used to form the material in FIGS. 3i and 3j. The material in FIGS. 3i and 3j, however, includes one or more conductive layers 314, that are deposited within the dielectric material 300 (for example, by alternating deposition of the material of layers 314 and the material of layer(s) 300). Layers 314 are preferably formed of relatively low RF interactive material as described above in the summary of the invention. This low conductivity material 314 has a relatively low charge carrier mobility when compared to the material of layer 316 and electrodes 310. Thus the DC (or low frequency AC) biasing signal is applied between layers 316 and 314 or 314 and S (for a single layer 314 as shown in FIG. 3i) or between the layers 314 (as shown in FIG. 3j). Therefore, the DC electric field is applied over distance $d_{DC}$, while the RF signal electric field is applied over distance $d_{RF}$. This results in a greater DC field to adjust the dielectric constant of electrically adjustable dielectric material 300, with a weaker RF field to avoid affecting the dielectric constant at an RF rate (that can cause IMD). The low conductivity material of layers 314 also helps to reduce interaction with the RF signal.

Figure 4:
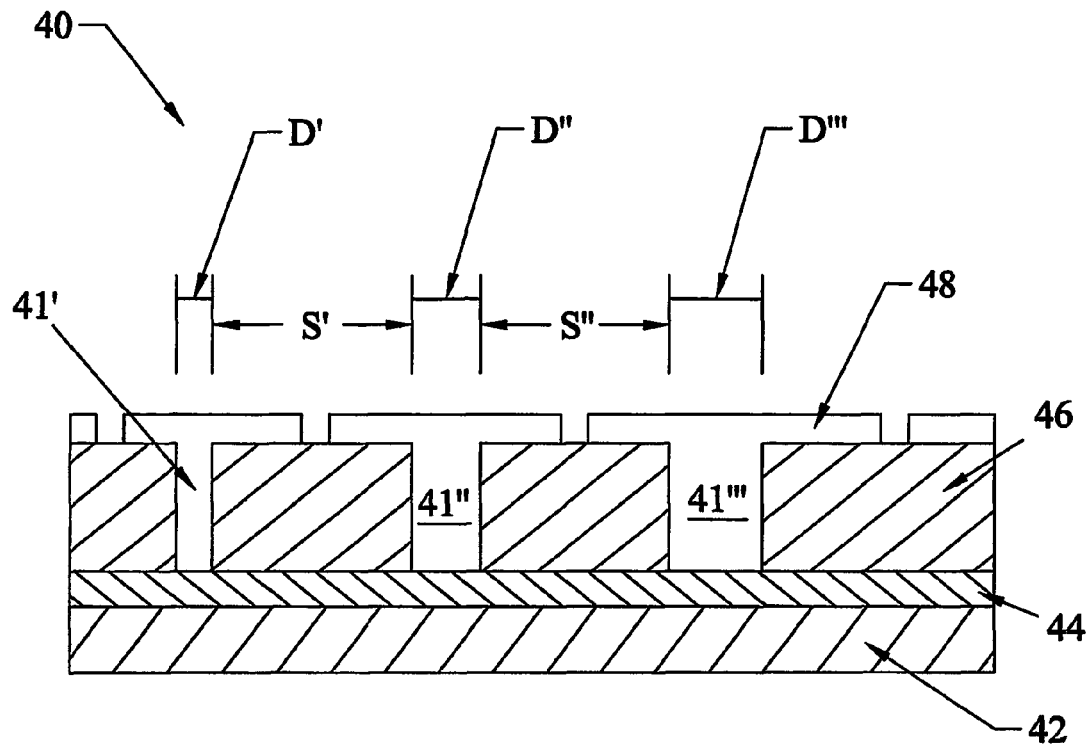
FIG. 4 shows a cross section through a further embodiment of the capacitor material of the present invention.
Figure 5:
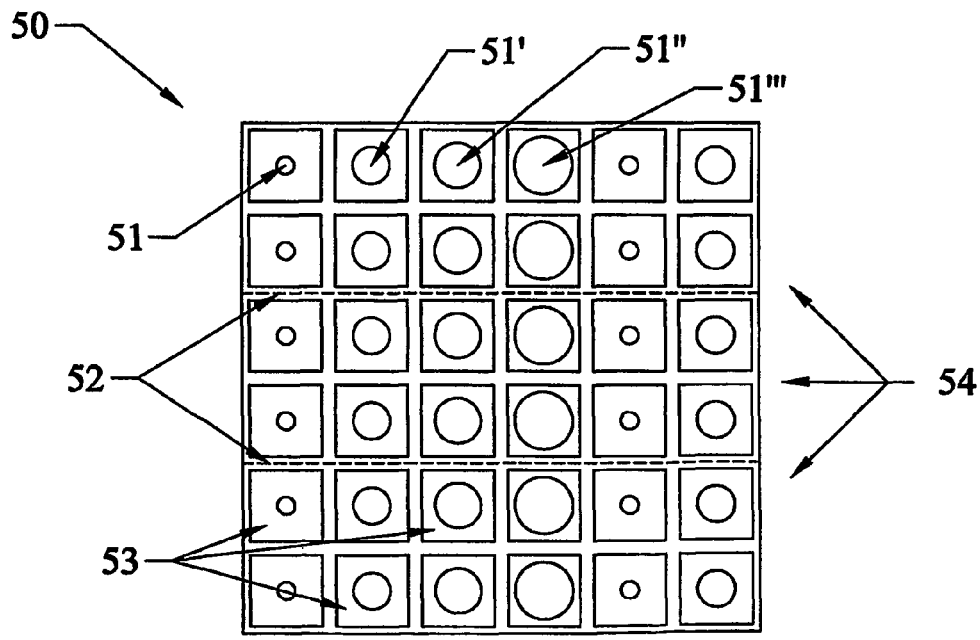
FIG. 5 shows a top view of another embodiment of the capacitor material.
Figure 6:
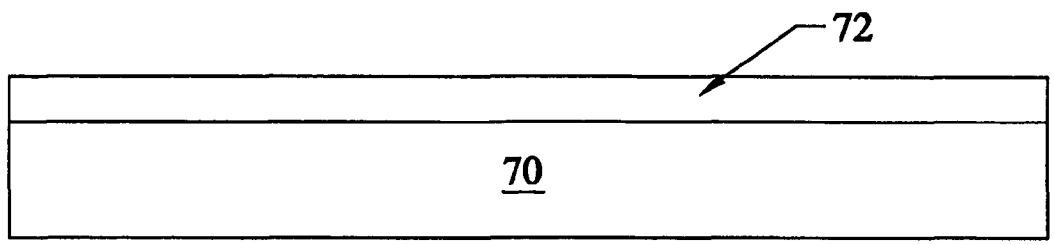
FIGS. 6–11 show the steps in forming dielectric and electrode structures on a substrate, in accordance with a method of the present invention for forming electronic and optical devices.
Figure 7:
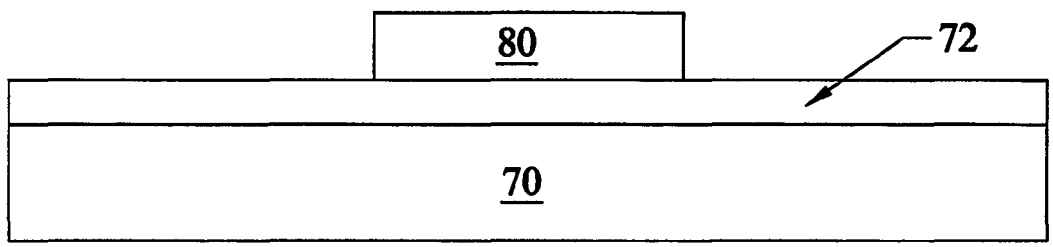
Figure 8:
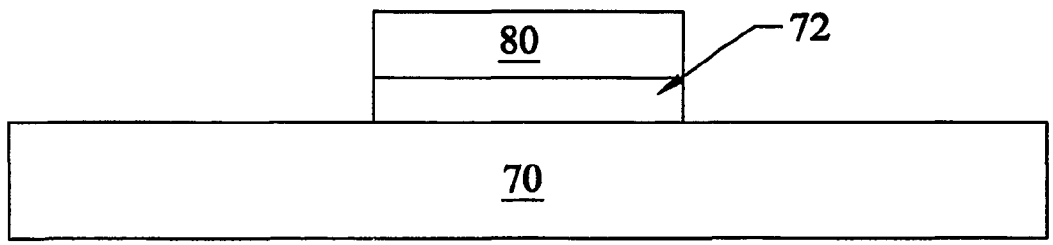

In FIGS. 4 and 5, further embodiments of the capacitive material of FIGS. 1 and 2 are shown. As with the previous embodiment, material 40 includes a conductive substrate 42 coated with a layer of dielectric material 44 having a relatively high dielectric constant (k). On top of the dielectric material 44 is a layer of insulative material 46 or material having a relatively low dielectric constant (k). The insulative material 46 is either not deposited or removed from the electrode site 41, and conductive material 48 is deposited thereon to form the electrode sites 41', 41" and 41''', each having a different diameter, D', D" and D''', respectively. Further, the spacing between the electrode sites may also vary as shown by S' and S". In contradistinction to the embodiment of FIGS. 1 and 2, the electrode sites 41', 41" and 41''' are not electrically connected to one another. The top electrode layer is pattern plated to provide each site with its own distinct top pad. By varying the spacing and diameter of the electrode sites, a material 50 as shown in FIG. 5 can be formed. Material 50 has a plurality of electrode sites 51, 51', 51" and 51''' each having a different effective diameter. The tops of each of the electrode sites include, a conductive pad 53, that is shown here as having a square shape, although circular or other shapes would work as well. The pads 53 are shown as similar in size, although they may vary as long as they are all large enough to be electrically connected to one another using jumpers (or simply solder). By cutting the material 50 into different sections (for example as shown by dotted lines 52, a number of mechanically adjustable capacitors 54 are formed. Each capacitor 54 can then be adjusted by attaching the pads of several electrode sites together. Because each site has a different capacitance, they can be added together to form the desired overall capacitance.

Figure 9:
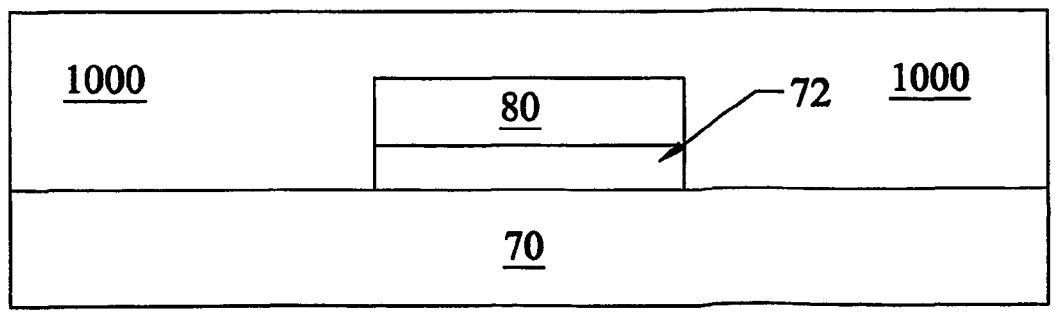
Figure 10:
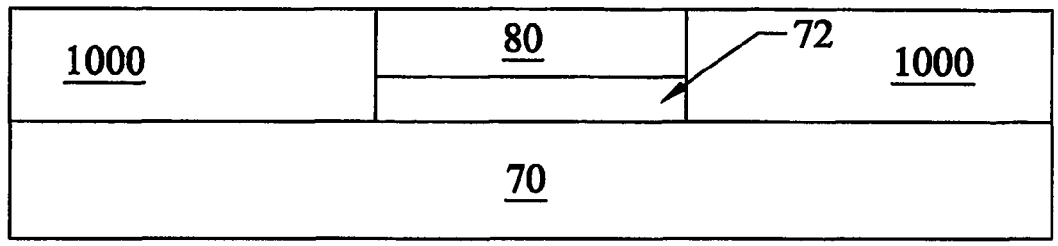
Figure 11:
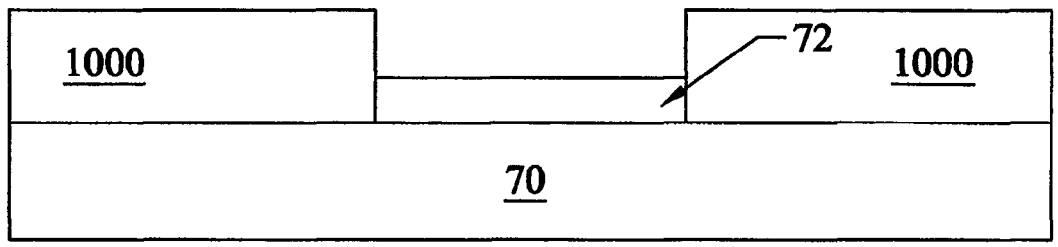

FIGS. 6–11 illustrate a method of forming dielectric and electrode structures according to another aspect of the present invention. A layer of dielectric material 72 (such as BST) is first deposited on a substrate 70 (such as sapphire). A layer of photoresist 80 is then deposited on top of those portions of the dielectric layer 72 that are intended to remain. The remainder of the dielectric material (not covered by the photoresist 80) is then etched away using a suitable etchant for the particular dielectric material used. A layer of conductive material 1000 (such as copper) is then deposited on top of the structure (FIG. 9). It should be noted that it is not necessary to remove the photoresist 80 prior to depositing the conductive material 1000. The top of the conductive layer is then etched to remove the portion on top of the photoresist layer 80 to thereby form the distinct electrodes 1000 as shown in FIG. 10. In FIG. 11 the optional step of removing the photoresist 80 is illustrated. It should be understood that the photoresist 80 may be left intact as it does not affect the operation of most devices. In fact, the photoresist 80 may add strength to the structure. The main advantage of this method is the reduced number of steps to produce the device or devices. A single masking step is required, by simply etching the electrode material to the level of the mask (photoresist layer 80), unwanted conductive material is removed.

Figure 12:
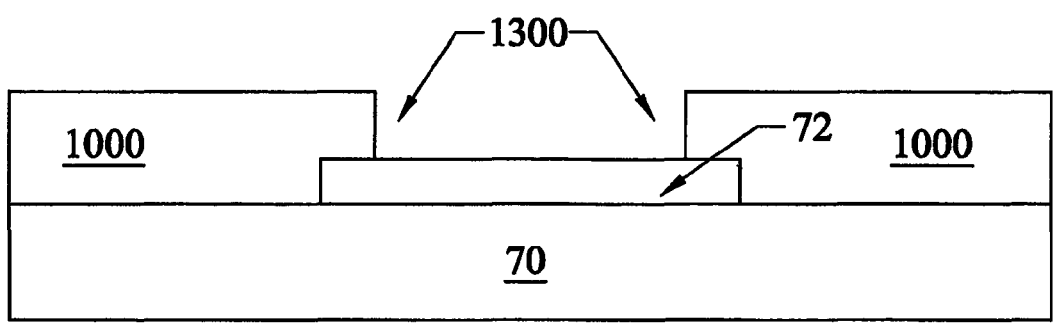
FIG. 12 shows another embodiment of the structures of FIGS. 6–11.

FIG. 12 illustrates a further embodiment of an electrode and dielectric structure for use in optic and RF applications. In this device, a portion of the dielectric material 72 extends under the electrodes 1000 as shown at points 1300. By extending the electrodes 1000 over the top of the edges of the dielectric, more of the applied electric field between the electrodes may permeate the dielectric, therefore creating a larger change on the dielectric constant/index of refraction in ferroelectric/electrooptic materials. Another advantage of the structures of FIGS. 11 and 12 over prior art devices involves adhesion of the electrodes to the device. In prior art devices, often the dielectric layer completely covers the substrate, and the electrodes are pattern plated on top of the dielectric material. Some conductors (such as chrome, gold and copper) have adhesion problems when deposited on top of certain dielectrics (such as BST). By patterning the dielectric, the electrode material is predominately deposited directly onto the substrate, thus the adhesion problems between the conductors and the dielectric layer can be minimized.

Figure 13:
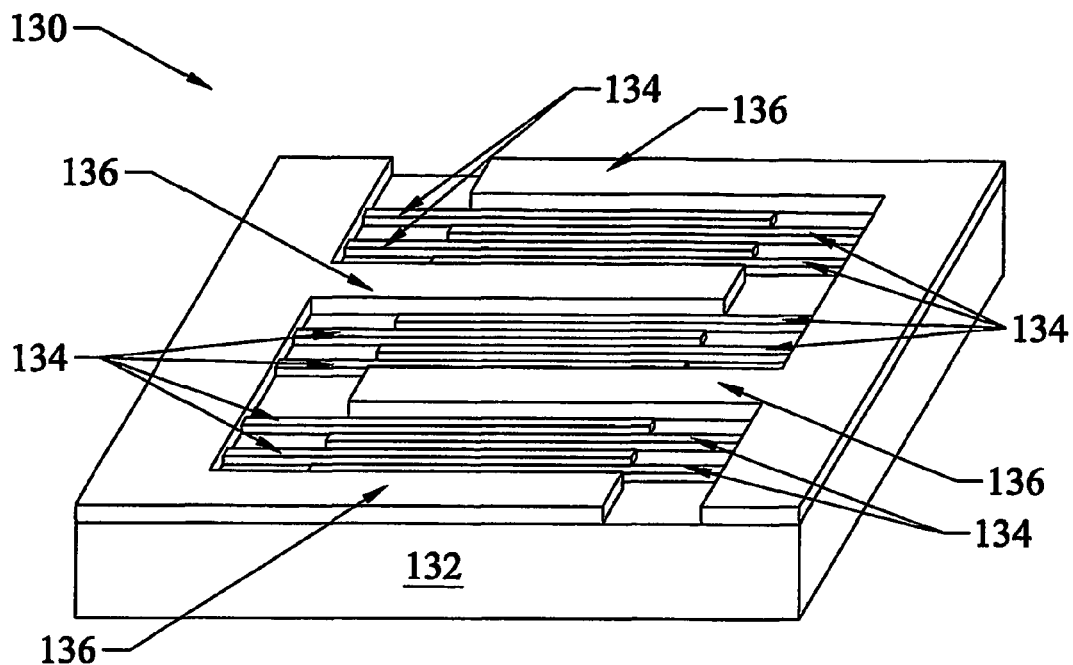
FIGS. 13–17 show further embodiments of the electrodes of the present invention.

In FIG. 13, a further embodiment of the improved electrodes of the present invention is shown in connection with capacitor 130. Capacitor 130 is formed by depositing (or otherwise attaching) RF electrodes 136 and biasing electrodes 134 on top of a bulk dielectric material 132. Bulk dielectric material is commercially available and can be obtained as tunable material (such as BST) or non-tunable material. In a parallel plate configuration, bulk dielectric material is difficult to use to form higher value capacitors, as the increased thickness of the material (d), reduces the overall capacitance of the capacitor (capacitance is proportional to A/d, where A is the area of the plates and d is the distance between the plates). In the present capacitor, interdigital fingers 134 are used, so the distance between the fingers (d) can be made quite small (less than 10 microns, preferably less than 5 microns and most preferred, less than 1 micron). The number of fingers can be increased to increase the area of the fingers facing one another. Bulk material 132 can be thick (0.5 mm, 1 mm and even greater than 5 mm) without affecting the performance of the capacitor. Obviously, the RF and biasing electric fields will only permeate into the top portion of the bulk material 132, but this is adequate for increasing the capacitance and/or the adjustability of the device. Biasing electrodes 134 are straight and predominately parallel to the RF electrodes 136, such that the biasing electric field and the RF electric field are predominately parallel in the region of the biasing electrodes 134.

Biasing electrodes 134 are preferably formed of relatively lower conductivity (low charge carrier mobility and/or number of charge carriers) material. Preferably this lower conductivity material has a resistance of more than 100 Ω/square. RF electrodes 136 are formed of relatively higher conductive material. Due to the closer spacing of the biasing electrodes 134, the electric field from the DC (or low frequency AC) biasing signal is stronger than the electric field induced by the RF signal. If the resistivity of the low conductivity material is predominately caused by reduced charge carrier mobility, the RF signal changes too fast to move the low mobility charge carriers in fingers 134. Thus tunability can be achieved, without introducing undesired IMD.

Figure 14:
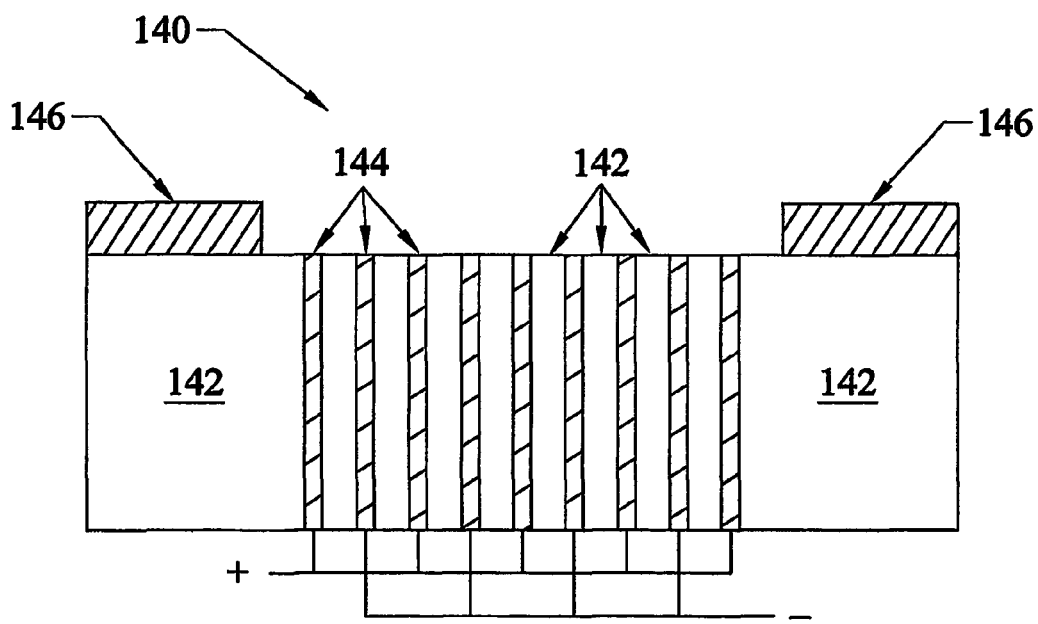

In FIG. 14, a further embodiment of a capacitor 140 using the relatively lower conductivity material is shown. Alternating layers of dielectric material 142 and lower conductivity material 144 are formed by alternating deposition (horizontally as shown) or other known methods. RF electrodes 146 are then deposited on top as shown. As in the previous embodiments, the RF electrodes exert the RF electric field over a greater distance, while the DC electric field is exerted over a smaller distance (between layers 144). Layers 144 may be formed with other, better conductors, as low conductivity material will decrease RF interaction, but high loss can be associated with thick layers of low charge carrier mobility material.

Figure 15:
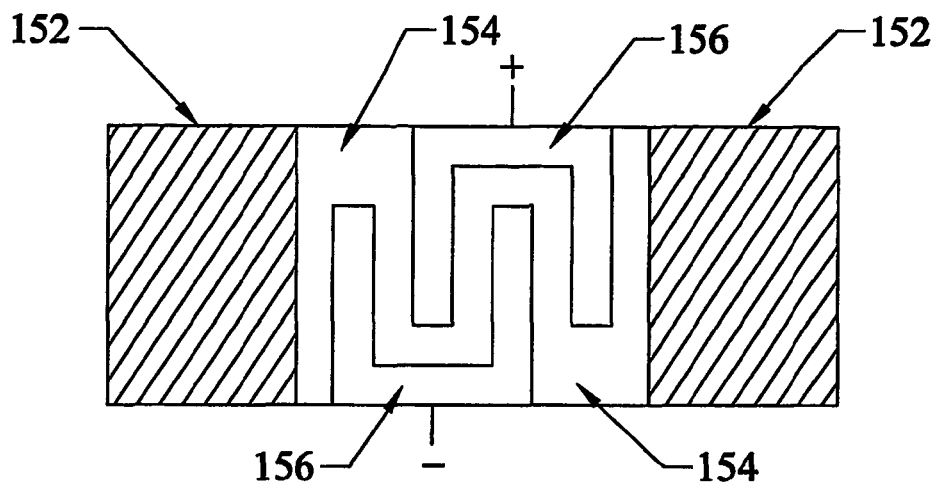
Figure 16:
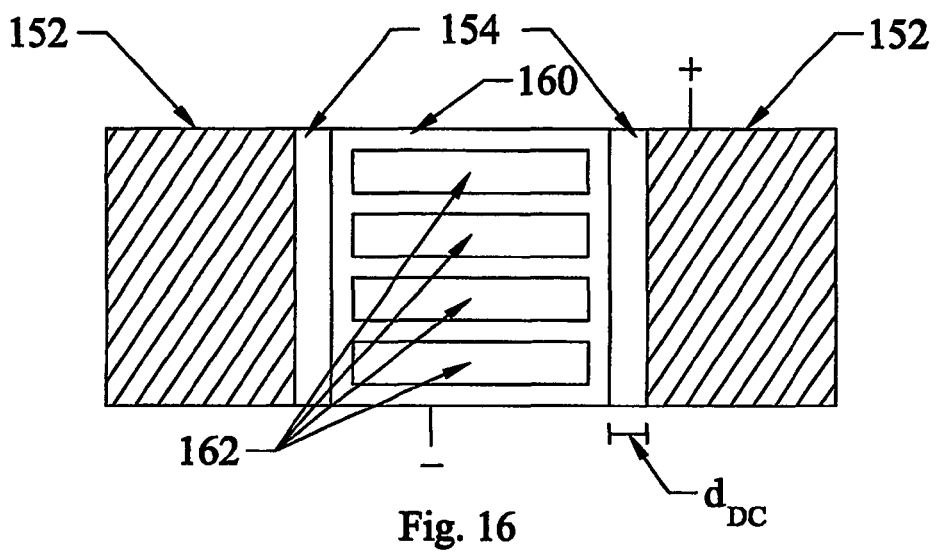
Figure 17:
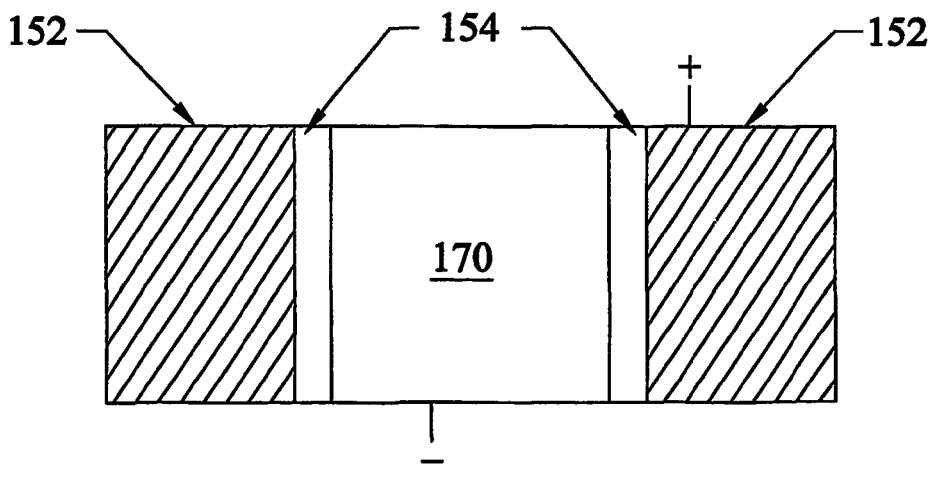

In FIGS. 15–17, top views of RF electrodes 152 are shown on a bulk dielectric 154, with three different embodiments of additional electrodes or dielectric enhancing material. In these embodiments, the low conductivity material of the biasing electrodes has a high mobility, but a controlled number of charge carriers. The biasing electrodes not only help to apply the tuning voltage, but also provide dipoles that can increase the effective dielectric constant between the RF electrodes. The DC bias not only tunes the dielectric material (if tunable), but locks the limited charge carriers (dipoles) of the electrodes in place, resulting in a lower "artificial dielectric effect." This results in providing an even greater degree of tuning.

In FIG. 15, the additional electrodes 156 are in the form of interdigital fingers. Electrodes 156 are formed of a high charge carrier mobility material that has a limited number of charge carriers. The high charge carrier mobility material enhances the dielectric constant of the dielectric 154. Because of the reduced number of charge carriers, however, this effect is reduced when the DC field is applied between electrodes 156. The distance between the RF electrodes 152 is much greater than the distance between the DC electrodes 156, providing the advantages described above with reference to the other embodiments.

In FIG. 16, electrode 160 is also formed of high charge carrier mobility material that has a limited number of charge carriers. Using selective deposition, or etching, windows 162 are formed in electrode 160, to further limit the number of charge carriers. When a DC bias is applied between one of the RF electrodes 152 (shown as the right) and electrode 160, the DC field is again applied over a much shorter distance ($d_{DC}$) than the distance between the RF electrodes. The DC field also helps to lock some of the charge carriers in place to reduce the dielectric enhancement normally provided by the high charge carrier mobility material.

In FIG. 17, a much simpler embodiment of FIG. 16 is shown. This description of FIG. 16 is identical to that of FIG. 17 except that electrode 170 has amore limited number of charge carriers, and therefore, the windows 162 of FIG. 16 are not needed. Alternatively, the center portion or portions of the sheet 170 are etched or selectively deposited with less material than the edges of the sheet proximate to the RF electrodes. This has much the same effect as forming windows 162.

What is claimed is:

1. A multi-layer material for forming at least one capacitor, said material comprising:
    a first continuous layer of conductive material;
    a second continuous layer of material having a relatively high dielectric constant;
    a third layer having conductive regions and insulative regions, said conductive regions being formed of conductive material to form electrode sites, said insulative regions being formed about and between adjacent electrode sites; and
    a fourth layer of conductive material electrically connected to said conductive material in the electrode sites; wherein
    said electrode sites have a first area, and said fourth layer has a second area, and said second area is at least twice said first area.

2. The material of claim 1, wherein said second layer is between 100 nm and 1 micron in thickness.

3. The material of claim 1, wherein said second layer is between 150 nm and 500 nm in thickness.

4. The material of claim 1, wherein said third layer is at least 10 times thicker than said second layer.

5. The material of claim 1, wherein each of the electrode sites have a diameter between 4 and 15 microns.

6. The material of claim 1, wherein the material has an overall capacitance, and the amount of capacitance provided by said electrode sites is at least 75% of the overall capacitance of the material.

7. The material of claim 1, wherein the material has an overall capacitance, and the amount of capacitance provided by said electrode sites is at least 99% of the overall capacitance of the material.

8. The material of claim 1, wherein said second layer is made of a voltage tunable dielectric material.

9. The material of claim 1, further comprising at least one layer of low conductivity material within said second layer.

10. The material of claim 9, wherein said low conductivity material has a charge carrier mobility of less than 10 $cm^2/V \cdot s$.

11. A capacitor with at least one electrode, said electrode having a surface with a first portion adjacent to a thin dielectric and a second portion exposed to a thicker insulator, wherein the capacitor has an overall capacitance, and the amount of capacitance provided by said first portion is at least 95% of the overall capacitance of the capacitor.

12. The capacitor of claim 11, wherein the capacitor has an overall capacitance, and the amount of capacitance provided by said first portion is at least 99% of the overall capacitance of the capacitor.

13. The capacitor of claim 11, wherein the second portion is at least 20 times larger in area than said first portion.

14. A printed wiring board comprising a capacitor with at least one electrode, said electrode having a surface with a first portion adjacent to a thin dielectric and a second portion exposed to a thicker insulator, wherein the capacitor has an overall capacitance, and the amount of capacitance provided by said first portion is at least 75% of the overall capacitance of the capacitor.

15. The printed wiring board of claim 14, wherein the capacitor has an overall capacitance, and the amount of capacitance provided by said first portion is at least 95% of the overall capacitance of the capacitor.

16. The printed wiring board of claim 14, wherein the thin dielectric is between 100 nm and 1 micron in thickness.

17. An electrical device or component containing a capacitor with at least one electrode, said electrode having a surface with a first portion adjacent to a thin dielectric and a second portion exposed to a thicker insulator, and said capacitor being bonded to or contained within said electrical device or component, wherein the capacitor has an overall capacitance, and the amount of capacitance provided by said first portion is at least 75% of the overall capacitance of the capacitor.

18. The electrical device or component of claim 17, wherein the capacitor has an overall capacitance, and the amount of capacitance provided by said first portion is at least 95% of the overall capacitance of the capacitor.

19. The electrical device or component of claim 17, wherein the capacitor has an overall capacitance, and the amount of capacitance provided by said first portion is at least 99% of the overall capacitance of the capacitor.

20. A laminate material for forming at least one capacitor, said material comprising:
    a first continuous layer of conductive material;
    a second continuous layer of material having a relatively high dielectric constant;
    a third layer having conductive regions and insulative regions, said conductive regions being formed of conductive material to form electrode sites, said insulative regions being formed about and between adjacent electrode sites; and
    a fourth layer having conductive regions and insulative regions, said conductive regions of said fourth layer each being electrically connected to one of said electrode sites; wherein
    said conductive regions in said fourth layer can be selectively connected to one another to thereby form capacitors with a desired capacitance.

21. The material of claim 20, wherein said second layer is between 100 nm and 1 micron in thickness.

22. The material of claim 20, wherein each of the electrode sites have a diameter between 1 and 40 microns.

23. The material of claim 20, wherein each of the electrode sites have a diameter between 4 and 15 microns.

24. The material of claim 20, wherein the material has an overall capacitance, and the amount of capacitance provided by said electrode sites is at least 99% of the overall capacitance of the material.

25. A capacitor comprising:
a dielectric material having a surface;
a first RF electrode formed on said surface;
a first biasing electrode formed on said surface;
a second biasing electrode formed on said surface; and
a second RF electrode formed on said surface; wherein
said first RF electrode is spaced a first distance from said second RF electrode;
said first biasing electrode is spaced a second distance from said second biasing electrode;
said first distance is greater than said second distance; and
said RF electrodes form interdigital fingers with one another and said
biasing electrodes form interdigital fingers with one another.

26. The capacitor of claim 25 wherein said dielectric material has a thickness of 1 mm or greater.

27. The capacitor of claim 25 wherein said biasing electrodes are formed of a conductive material having a resistance of 100 Ω/square or greater.

28. The capacitor of claim 25 wherein said second distance is less than 5 microns.

29. The capacitor of claim 25 wherein said biasing electrodes are straight.

30. The capacitor of claim 25 wherein said biasing electrodes are predominately parallel to said RF electrodes, such that an applied biasing electric field and an applied RF electric field are predominately parallel to one another in the region of the biasing electrodes.

31. A capacitor comprising:
a dielectric material portion;
a first RF electrode on said dielectric material portion;
a second RF electrode on said dielectric material portion; and
at least one layer of lower conductivity material within said dielectric material portion and between said RF electrodes.

32. The capacitor of claim 31 wherein said dielectric material is tunable, and a bias voltage is applied between said at least one layer of lower conductivity material and at least one of said RF electrodes.

33. The capacitor of claim 31 wherein said at least one layer of lower conductivity material comprises at least two layers of lower conductivity material; said dielectric material is tunable and a bias voltage is applied between said at least two layers of lower conductivity material.

34. A capacitor comprising:
a bulk dielectric material having a surface;
a first RF electrode formed on said surface;
at least one biasing electrode formed on said surface; and
a second RF electrode formed on said surface; wherein
said first RF electrode is spaced a first distance from said second RF electrode;
said at least one biasing electrode is spaced a second distance from one of said RF electrodes;
said first distance is greater than said second distance; and
said at least one biasing electrode is formed of a low conductivity material
having a charge carrier mobility of greater than 30 cm$^2$/V·s and a controlled charge carrier density.

35. The capacitor of claim 34 wherein said at least one biasing electrode comprises two biasing electrodes.

36. The capacitor of claim 34 wherein said at least one biasing electrode has at least one edge proximate to said RF electrodes, and said edge includes more low conductivity material than the remainder of said at least one biasing electrode.

37. The capacitor of claim 34 wherein said sheet includes several holes or windows that do not contain said low conductivity material.

38. The capacitor of claim 34 wherein when a bias voltage is applied to said at least one biasing electrode, said controlled charge carrier density is 70% of the total available charge carriers.

* * * * *